(12) United States Patent
Gotschke et al.

(10) Patent No.: US 10,475,959 B2
(45) Date of Patent: Nov. 12, 2019

(54) METHOD FOR PRODUCING A NITRIDE SEMICONDUCTOR COMPONENT, AND A NITRIDE SEMICONDUCTOR COMPONENT

(71) Applicant: OSRAM Opto Semiconductors GmbH, Regensburg (DE)

(72) Inventors: Tobias Gotschke, Berlin (DE); Bastian Galler, Regensburg (DE); Juergen Off, Regensburg (DE); Werner Bergbauer, Windberg (DE); Thomas Lehnhardt, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/579,561

(22) PCT Filed: Jun. 15, 2016

(86) PCT No.: PCT/EP2016/063744
§ 371 (c)(1),
(2) Date: Dec. 4, 2017

(87) PCT Pub. No.: WO2016/202853
PCT Pub. Date: Dec. 22, 2016

(65) Prior Publication Data
US 2018/0175243 A1    Jun. 21, 2018

(30) Foreign Application Priority Data
Jun. 18, 2015    (DE) .................. 10 2015 109 761

(51) Int. Cl.
*H01L 33/22*    (2010.01)
*H01L 33/00*    (2010.01)
*H01L 33/12*    (2010.01)

(52) U.S. Cl.
CPC ........... *H01L 33/22* (2013.01); *H01L 33/007* (2013.01); *H01L 33/0075* (2013.01); *H01L 33/0079* (2013.01); *H01L 33/12* (2013.01)

(58) Field of Classification Search
CPC ... H01L 33/22; H01L 33/007; H01L 33/0075; H01L 33/0079; H01L 33/12
See application file for complete search history.

(56) References Cited

U.S. PATENT DOCUMENTS 6,325,850 B1 * 12/2001 Beaumont ............... C30B 25/02
     117/95
2003/0037722 A1 * 2/2003 Kiyoku .................. B82Y 20/00
     117/84

(Continued)

FOREIGN PATENT DOCUMENTS

CN    1678771 A    10/2005
CN    102169936 A    8/2011

(Continued)

OTHER PUBLICATIONS

Notice of Reasons for Rejection dated Dec. 11, 2018, issued against corresponding Japanese Patent Application No. 2017-553036, including English Translation (16 pages).

(Continued)

*Primary Examiner* — Sitaramarao S Yechuri
(74) *Attorney, Agent, or Firm* — McDermott Will & Emery LLP

(57) ABSTRACT

The invention relates to a method for producing a nitride semiconductor component (100), comprising the steps of: —providing a growth substrate (1) having a growth surface (10) formed from a planar area (11) with a plurality of three-dimensionally shaped surface structures (12) on said planar area (11), —growing a nitride-based semiconductor layer sequence (30) on the growth surface (10), growth beginning selectively on a growth area (13) of said growth (Continued)

substrate, and the growth area (13) being less than 45% of the growth surface (10). The invention also relates to a nitride semiconductor component (100) which can be produced according to said method.

17 Claims, 5 Drawing Sheets

(56) References Cited

U.S. PATENT DOCUMENTS

| | | |
|---|---|---|
| 2003/0141512 A1 | 7/2003 | Bruderl et al. |
| 2006/0084245 A1* | 4/2006 | Kohda ............... H01L 21/0237 438/478 |
| 2006/0099781 A1 | 5/2006 | Beaumont et al. |
| 2008/0303042 A1 | 12/2008 | Minato et al. |
| 2011/0012109 A1 | 1/2011 | Kryliouk et al. |
| 2011/0150017 A1 | 6/2011 | Chua et al. |
| 2012/0007039 A1* | 1/2012 | Ueta ............... H01L 21/0237 257/13 |
| 2012/0273821 A1 | 11/2012 | Wei et al. |
| 2013/0214285 A1* | 8/2013 | Stauss ............... H01L 33/007 257/76 |
| 2014/0054605 A1 | 2/2014 | Iwai et al. |
| 2014/0061661 A1* | 3/2014 | Sako ............... C30B 25/186 257/76 |
| 2014/0273322 A1* | 9/2014 | Yoo ............... H01L 33/46 438/29 |

FOREIGN PATENT DOCUMENTS

| | | |
|---|---|---|
| CN | 103165771 A | 6/2013 |
| CN | 104112803 A | 10/2014 |
| DE | 102008010318 A1 | 9/2008 |
| DE | 102012103394 A1 | 10/2013 |
| DE | 102014101966 A1 | 8/2015 |
| JP | 2000-021789 A | 1/2000 |
| JP | 2011-046544 A | 3/2011 |
| JP | 2013-522152 A | 6/2013 |
| JP | 2015-501526 A | 1/2015 |
| TW | 200414573 A | 8/2004 |
| TW | 200603436 A | 1/2006 |
| TW | I366281 B | 6/2012 |
| TW | 201322487 A | 6/2013 |
| WO | 2002103813 A1 | 10/2004 |
| WO | 2004105108 A2 | 12/2004 |
| WO | 2013045181 A1 | 4/2013 |

OTHER PUBLICATIONS

First Office Action dated Jan. 9, 2019, issued against corresponding Chinese Patent Application No. 201680033433.4, including English translation (16 pages).

Examination Report dated Apr. 2, 2019, issued in Japanese Patent Application No. 2017-563036.

* cited by examiner

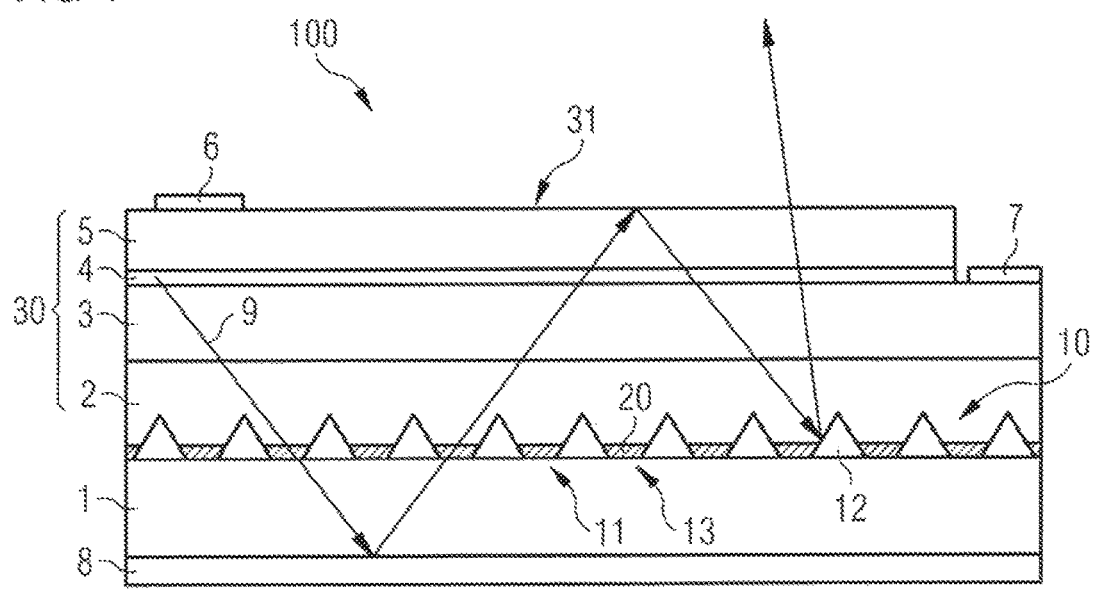

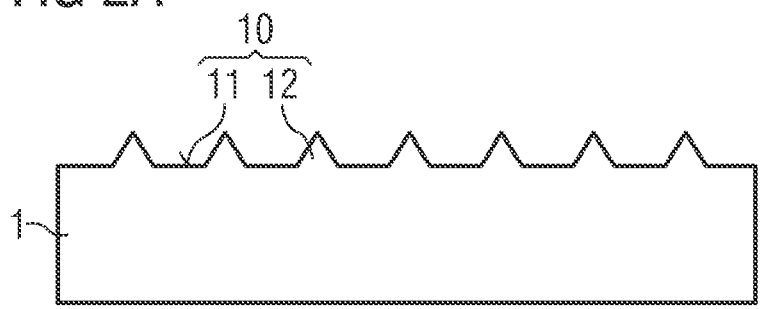
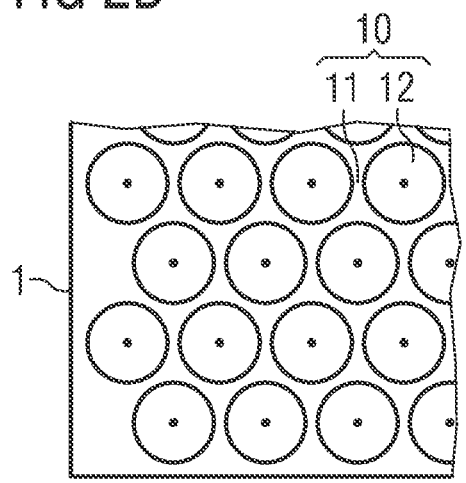
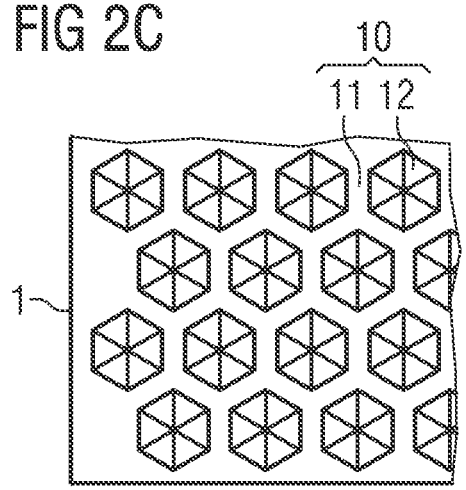

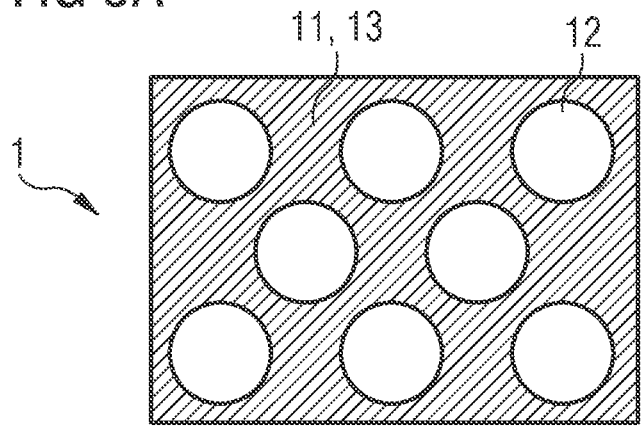
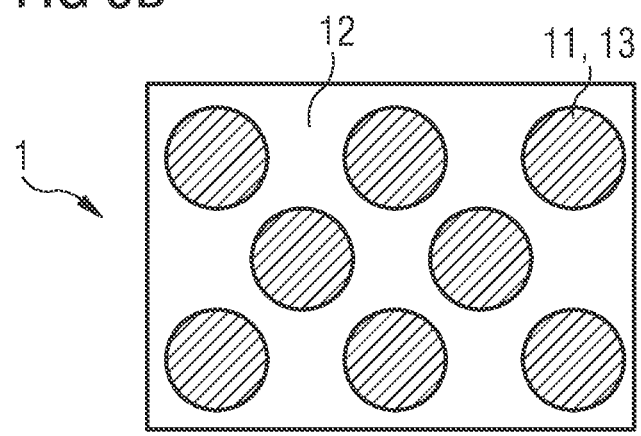
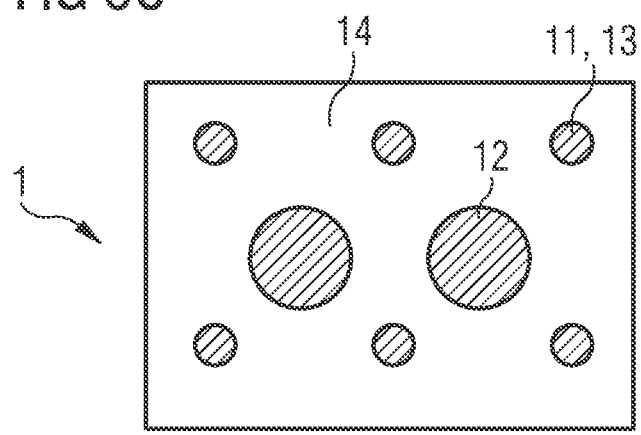

METHOD FOR PRODUCING A NITRIDE SEMICONDUCTOR COMPONENT, AND A NITRIDE SEMICONDUCTOR COMPONENT

The invention relates to a method for producing a nitride semiconductor component, in particular an optoelectronic nitride semiconductor component.

This patent application is the U.S. National Phase under 35 U.S.C. §371 of International Patent Application No. PCT/EP2016/063744, filed on Jun. 15, 2016, which in turn claims priority from German patent application 10 2015 109 761.3, filed on Jun. 18, 2015, the disclosure content of which is hereby incorporated by reference.

For producing nitride semiconductor components such as LEDs, the functional layers of the component are usually epitaxially deposited on a suitable growth substrate. Sapphire substrates are especially suited for growing nitride compound semiconductor layers thereon. When a nitride compound semiconductor is heteroepitaxially grown on sapphire, defects may form in the semiconductor material owing to the lattice mismatch present therein. These defects occur especially in a growth zone of the nitride semiconductor material at the interface with the growth substrate. This may impair the efficiency of the component. In operation of a radiation-emitting nitride semiconductor component, such increased defect density in the growth areas may, in particular, result in radiation to be absorbed at the interface between the growth substrate and the semiconductor layer sequence.

One object to be achieved is to provide an improved method for producing a nitride semiconductor component which provides a reduced defect density at the interface with the growth substrate. Furthermore, a nitride semiconductor component is to be provided which is characterized by a low defect density at the interface with the growth substrate so as to reduce absorption at this interface, for example.

These objects are achieved by a method for producing a nitride semiconductor component and by a nitride semiconductor component as specified in the independent claims. Advantageous embodiments and further developments of the method are the subject matter of the dependent claims.

The method, in at least one embodiment thereof, provides a growth substrate having a growth surface formed from a planar area with a plurality of three-dimensionally shaped surface structures on the planar area. The growth substrate has a growth surface on which semiconductor layers are deposited in subsequent method steps. The growth surface is formed from a planar area with a plurality of three-dimensionally shaped surface structures formed thereon. In other words, the growth surface has a two-dimensionally shaped area, constituted by the planar surface, as well as three-dimensionally shaped areas, constituted by the surface structures which protrude from the plane defined by the planar area. In view of the three-dimensional surface structures on the planar area of the growth surface, the substrate can also be referred to as a prestructured substrate.

The surface structures can be constituted by protrusions, for example, which extend away from the planar area. It is particularly preferred for these protrusions to be conical and thus, in a top view perspective of the growth surface, to be round in cross-section, or to be pyramidal and thus, in a plan view perspective of the growth surface, to be polygonal in cross-section, for example of a triangular, square, hexagonal or any other polygonal shape.

In another embodiment, a semiconductor layer sequence is grown on the growth surface in a further step of the method. The semiconductor layer sequence can in particular be grown using an epitaxial growth method such as MOVPE (metal organic vapor phase epitaxy).

The semiconductor layer sequence can in particular be a nitride-based semiconductor layer sequence. The term "nitride-based" in particular covers semiconductor layers and semiconductor layer sequences which include a material from the III-V compound semiconductor material system $In_xAl_yGa_{1-x-y}N$, with $0 \le x \le 1$, $0 \le y \le 1$ and $x+y \, 0 \le 1$, such as GaN, AlN, AlGaN, InGaN or AlInGaN, for example. The semiconductor layer sequence can comprise dopants as well as additional constituents. For reasons of simplicity, however, only the major constituents of the crystal lattice of the semiconductor layer sequence, i.e. Al, Ga, In as well as N, are indicated, even if these can be partially replaced and/or supplemented by minor amounts of additional substances.

In the method, growth of the semiconductor layer sequence advantageously begins selectively on a growth area of the growth substrate, the growth area being only part of the growth surface of the growth substrate. Specifically, the growth area is preferably less than 45% of the growth surface, more preferably less than 25% of the growth surface, and most preferably less than 5% of the growth surface.

In particular, the method makes use of the realization that an increased defect density is present in those areas where the nitride semiconductor material of the semiconductor layer sequence starts growing. The method reduces the defect density present in the interface between the growth substrate and the semiconductor layer sequence, and possibly also in the subsequent layers, by minimizing the growth area such that it will be substantially smaller than the total area of the growth substrate. In a radiation-emitting component, this advantageously reduces absorption at the interface between the growth substrate and the nitride-based semiconductor layer sequence. This is particularly advantageous for those nitride semiconductor components whose growth substrate is not removed during production and thus remains in the finished component.

In at least one embodiment, the growth area is constituted by the planar area itself or by a portion thereof. When growing a nitride semiconductor material on a growth substrate having a planar area and a plurality of three-dimensionally shaped surface structures formed on the planar area, growth begins selectively in the region of the planar area. The nitride semiconductor material does not substantially grow on the three-dimensionally shaped surface structures; rather, the three-dimensionally shaped surface structures will only be overgrown in the lateral direction at a later growth stage of the nitride semiconductor material. The growth area can thus be minimized by reducing the ratio of the planar area, which at least partially constitutes the growth area, and the area having the three-dimensionally shaped surface structures thereon. Preferably, the planar area is less than 45%, more preferably less than 25%, and most preferably less than 5%, of the growth surface.

In yet another preferred embodiment, the growth area is less than the planar area. The growth area can be less than 90%, more preferably less than 60%, and most preferably less than 30%, of the planar area. This can in particular be achieved by growing a layer of a material on which a nitride semiconductor material essentially cannot grow, on part of the planar area, so as to reduce the growth area. In this case, the nitride semiconductor material is not grown on the entire planar area between the three-dimensional structures but only in those regions of the planar area which are not covered by this layer.

The material on which a nitride semiconductor material essentially cannot grow is preferably an oxide compound or a nitride compound. Preferably, the material is a silicon oxide, a silicon nitride or a titanium nitride.

In at least one embodiment, the growth area is constituted by a plurality of portions of the planar area that are not interconnected. The non-interconnected portions of the planar area can in particular be adjacent to the three-dimensional structures. The portions can be areas that are round, in particular circular, in shape, for example, and in which the planar area of the growth substrate is exposed between the three-dimensional structures. The portions can also be of a different geometric shape, such as polygonal, in particular square or hexagonal.

Alternatively or additionally, these non-interconnected portions of the planar area can also be openings in the layer of the material on which a nitride semiconductor material essentially cannot grow. In this case too, these portions can be areas which are round, in particular circular, or polygonal, in particular square or hexagonal, in shape, for example.

In at least another embodiment, a nucleation layer is deposited on portions of the planar area, the nucleation layer promoting the growth of a nitride semiconductor material thereon. The material of the nucleation layer can be aluminum nitride, in particular an oxygen-containing aluminum nitride (AlN:O), for example. The oxygen can be present in the nucleation layer as a dopant or even in the percentage range. The nucleation layer can be used to increase the selectivity of the growth. In particular, oxygen-containing AlN can be used to influence the selectivity with respect to the specific surface areas of the growth surface on which the semiconductor layer deposited on the nucleation layer grows.

In the method, the growth substrate preferably includes or consists of sapphire. Sapphire is preferably transparent to the radiation emitted by an optoelectronic component so that at least part of the radiation can be coupled out through the growth substrate. If radiation is to be emitted to a radiation exit surface of the nitride semiconductor layer sequence that is opposite to the growth substrate, a mirror layer can be provided on a rear side of the growth substrate which is opposite to the semiconductor layer sequence. Alternatively, the semiconductor chip can be arranged on a reflecting leadframe, for example, thus eliminating the need for a mirror layer.

The nitride-based semiconductor layer sequence which is deposited on the growth substrate preferably contains an n-doped semiconductor region, a p-doped semiconductor region and an active layer arranged between the n-doped semiconductor region and the p-doped semiconductor region. The active layer is preferably a layer suitable for the emission of electromagnetic radiation. More specifically, the nitride semiconductor component can be a light-emitting diode.

One embodiment of the nitride semiconductor component preferably comprises a growth substrate having a growth surface formed from a planar area with a plurality of three-dimensionally shaped surface structures on the planar area. A nitride-based semiconductor layer sequence is arranged on the growth surface. At an interface with the growth substrate, the nitride-based semiconductor layer sequence has first regions arranged on a growth surface, in which the defect density is higher than in second regions surrounding the first areas in the lateral direction, and in which the growth area is less than 45% of the growth surface, more preferably less than 25% of the growth surface, and most preferably less than 5%, of the growth surface.

In a preferred embodiment, the nitride semiconductor component is a radiation-emitting optoelectronic component in which the growth substrate is a transparent substrate. The transparent substrate can in particular be a sapphire substrate.

Additional advantageous embodiments of the nitride semiconductor component may be gathered from the foregoing description of the method for producing the nitride semiconductor component and vice versa.

In the following, the invention is explained in more detail with reference to FIGS. 1 to 5.

In the drawings,

FIG. 1 is a schematic view of a nitride semiconductor component,

FIG. 2A is a schematic view of a growth substrate, in cross-section,

FIGS. 2B and 2C are schematic views of growth substrates, in plan view,

FIG. 5A to 5C are schematic views of growth substrates, in plan view.

In the Figures, identical or identically acting components are in each case designated with the same reference characters. The components illustrated and the size ratios of the components to one another should not be regarded as to scale.

FIG. 1 is a view of an embodiment of a nitride semiconductor component 100. In the embodiment, the nitride semiconductor component 100 is a radiation-emitting optoelectronic component, in particular a light-emitting diode.

Figure 3A:
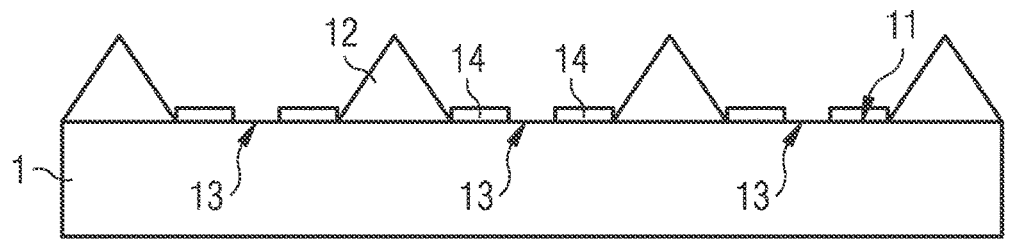
FIG. 3A to 3C are schematic views of intermediate steps of an embodiment of the method.

The nitride semiconductor component 100 comprises a growth substrate 1 which has a semiconductor layer sequence 30 deposited thereon. The semiconductor layer sequence 30 can be deposited epitaxially on the growth substrate 1, for example by means of MOVPE.

The semiconductor layer sequence 30 for example comprises a buffer layer 2 deposited on the growth substrate 1, as well as an n-doped semiconductor region 3, a p-doped semiconductor region 5 and a radiation-emitting active layer 4 disposed between the n-doped semiconductor region 3 and the p-doped semiconductor region 5. The buffer layer 2, the n-doped semiconductor region 3, the active layer 4 and the p-doped semiconductor region 5 can each comprise one or plural individual layers.

The semiconductor layer sequence 30 is preferably a nitride-based semiconductor layer sequence. The semiconductor layers 2, 3, 4, 5 of the semiconductor layer sequence 30 can in particular include $In_xAl_yGa_{1-x-y}N$, with $0 \leq x \leq 1$, $0 \leq y \leq 1$ and $x+y \leq 1$, such as GaN, AlN, AlGaN, InGaN, or AlInGaN, for example. The semiconductor layer sequence can include dopants as well as additional constituents.

The semiconductor layer sequence 30 can furthermore be provided with electrical contacts 6, 7 for supplying current thereto. For example, the nitride semiconductor component 100 can have a p-contact 6 and an n-contact 7.

The growth substrate 1 of the nitride semiconductor component 100 has a growth surface 10 on which the semiconductor layer sequence 30 has been grown. The growth surface 10 comprises a two-dimensionally shaped planar area 11 with a plurality of three-dimensionally shaped surface structures 12 arranged thereon.

Possible embodiments of the growth substrate 1 are illustrated in a cross-sectional view in FIG. 2A and in plan view in FIGS. 2B and 2C, for more clarity. As can be seen from the cross-sectional view of FIG. 2A, the surface structures 12 protrude from the plane formed by the planar area 11. The three-dimensionally shaped surface structures 12 are in the form of protrusions which extend vertically upwards from the planar area 11.

As shown in FIG. 2B, the surface structures 12 can be round, and in particular circular, in cross-section. The surface structures 12 can be formed as conical protrusions, for example. Alternatively, as shown in FIG. 2C, the surface structures can also be polygonal, in particular hexagonal, in cross-section, i.e. the surface structures 12 can also be formed on the planar area 11 as pyramidal protrusions. The planar area 11 extends between the surface structures 12 shaped as protrusions.

The growth substrate 1 can in particular include, or be made of, aluminum oxide. More specifically, the growth substrate 1 can be a sapphire substrate. It is particularly preferred for the planar area 11 to be constituted by a crystallographic c-plane or (–c)-plane of the aluminum oxide which is particularly suited for the growth of nitride-based semiconductor materials thereon. Consequently, the surfaces of the surface structures 12, according to their orientation relative to the planar area 11, are constituted by a plurality of other crystal surfaces.

Referring back to FIG. 1, the semiconductor layer sequence 30 has growth areas 20. These growth areas 20 only cover part of the growth surface 10. This is because, at the beginning of the epitaxial growth, the nitride semiconductor material selectively grows on growth areas 13 of the growth surface 10. In particular, it has turned out that the growth of a nitride semiconductor material on a structured growth substrate 1 which is formed by planar areas 11 and surface structures 12 arranged thereon, selectively begins on the planar areas 11. In the embodiment of FIG. 1, the growth areas 13 are therefore constituted by the planar areas 11.

It turns out that a higher defect density is present in the growth areas 20 than in the rest of the nitride-based semiconductor layer sequence 30. The defect density decreases as the surface structures 12 are overgrown laterally. A relatively low defect density can thus be achieved in the region of the functional layers 3, 4, 5 of the nitride-based semiconductor layer sequence 30. The quality of the functional layers 3, 4, 5 of the nitride semiconductor component 100 is therefore essentially not impaired by the higher defect density present in the growth areas 20.

The method and the nitride semiconductor component described herein make use of the realization, amongst others, that the higher defect density of the growth areas 20 may adversely affect the efficiency of the nitride semiconductor component, at least in that more of a light beam 9 emitted by the active layer 4 will be absorbed in the growth areas 20, owing to their higher defect density.

Illustrated by way of example in FIG. 1 is a light beam 9 which is emitted from the active layer 4 in the direction towards the growth substrate 1. The light beam 9 will for example traverse one of the growth areas 20 and the preferably transparent growth substrate 1 which can have a mirror layer 8 deposited on its rear side. After reflection at the mirror layer 8, the light beam 9 can then once more traverse the growth substrate 1 and one of the growth areas 20, for example. In the illustrated example, the light beam 9 reflected by the mirror layer 8 will impinge on the radiation exit surface 31 of the nitride semiconductor component, which surface is opposite to the mirror layer 8, at an angle of incidence which is greater than the critical angle of total reflection. For this reason, the light beam 9 will not be emitted directly but will again be deflected in the direction of the growth substrate 1 as a result of total internal reflection. In the region of the growth substrate 1, the light beam 9 will then for example impinge on one of the surface structures 12 where it will be reflected or diffracted in such a way that it will impinge on the radiation outcoupling surface 31 at an angle of incidence which is smaller than the critical angle of total reflection. In that event, the light beam will be coupled out of the nitride semiconductor component 100.

The higher absorption in the growth areas 20 as a result of the higher defect density reduces the efficiency of the nitride semiconductor component. Based on this insight, in the method and in the nitride semiconductor component, the growth area 13 is advantageously minimized to such an extent that the growth area 13 is less than 45%, more preferably less than 25%, and most preferably less than 5%, of the growth surface 10. This advantageously results in a smaller volume of the growth areas 20. Since the absorption correlates with the volume, reducing the growth areas 20 will result in reduced absorption and therefore, for a radiation-emitting nitride semiconductor component 100, in increased brightness.

Furthermore, lower absorption in the growth areas 20 has the advantage that absorption-related changes in the chromaticity point of the emitted radiation will also be reduced. In the event of absorption, the chromaticity point can change because the energy of the absorbed light can be emitted both in a non-radiation type form in the form of heat, or in the form of radiation through luminescent defects—which may cause the emission spectrum to change.

A reduction in the growth area 13 can be accomplished for example by decreasing the share of the planar area 11 in the total area of the growth surface 10 to less than 90%, more preferably less than 60%, and most preferably less than 30%. In the embodiment schematically illustrated in FIG. 1, this can be accomplished by adjusting the size and/or the density of the three-dimensional surface structures 12 so as to make the planar area 11 in the spaces between the surface structures 12 suitably small.

With a view to achieving a high share of the surface structures 12 in the total area of the growth surface 10, it can be advantageous for the surface structures 12 to differ at least partially in size and/or in shape. Using three-dimensional surface structures 12 each having a different lateral extent for example allows the growth surface 10 to be packed with a high density of three-dimensional surface structures 12. In this case, smaller surface structures 12 can at least partially fill the spaces between larger surface structures 12, for example.

For reducing the size of the growth areas 20, the process conditions for epitaxial growth can be set so as to increase the selectivity of the growth between the planar area 11 and the three-dimensional strucrures 12. This may for example take place during growth by means of MOVPE, for example by adjusting the ratio of the hydrides (H2, NH3) as well as the metal organyls (e.g. TMGa, TEGa, TMAl). In particular, with a view to improving selectivity, the supply of H2 can be increased or the supply of NH3, TMGa, TEGa or TMAl can be decreased. Furthermore, selectivity can be improved by increasing the growth temperature.

Figure 3B:
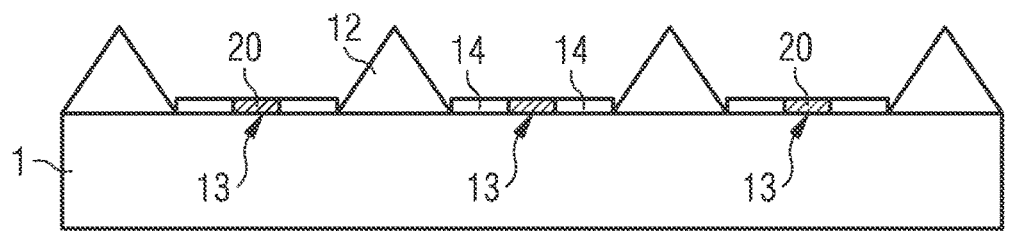
Figure 3C:
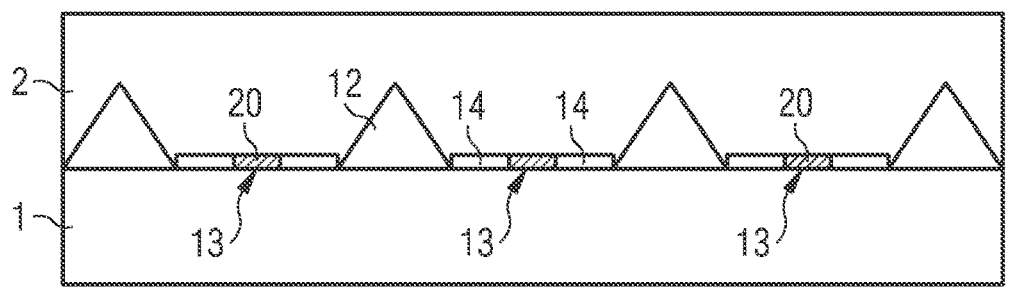

FIG. 3A to 3C are views of intermediate steps of one embodiment of the method. In this embodiment, the growth substrate 1—as in the foregoing embodiments—has a planar area 11 with three-dimensional surface structures 12 arranged thereon which may be conical or pyramidal, for example. As shown in FIG. 3A, a layer 14 has been deposited on parts of the planar area 11, which layer is formed from a material which does not at all or hardly permit the growth of a nitride compound semiconductor material thereon. The layer 14 can include a silicon nitride, a silicon oxide or a titanium nitride, for example.

Depositing the layer 14 results in an advantageous reduction in size of the growth area 13. The growth area 13 is advantageously constituted by openings in the layer 14 through which part of the planar area 11 of the growth substrate 1 is exposed. As a result, the growth area 13 is smaller than the planar area 11.

As shown in FIG. 3B, the growth of the nitride semiconductor layer sequence begins in growth areas 20 which are arranged on the growth areas 13. In contrast thereto, essentially no nitride semiconductor material grows on the three-dimensional surface structures 12 and on the layer 14.

In the intermediate step illustrated in FIG. 3C, the entire buffer layer 2 has been grown on. Starting from the growth areas 20, the layer 14 and the surface structures 12 are essentially laterally overgrown during growth of the buffer layer 2, which reduces the defect density. Advantageously, only the relatively small growth areas 20a therefore have a higher defect density. Once growth of the buffer layer 2, which may also comprise a plurality of partial layers, has been completed, the functional semiconductor layer sequence of an optoelectronic component, for example, can then be grown on in a further step.

Figure 4A:
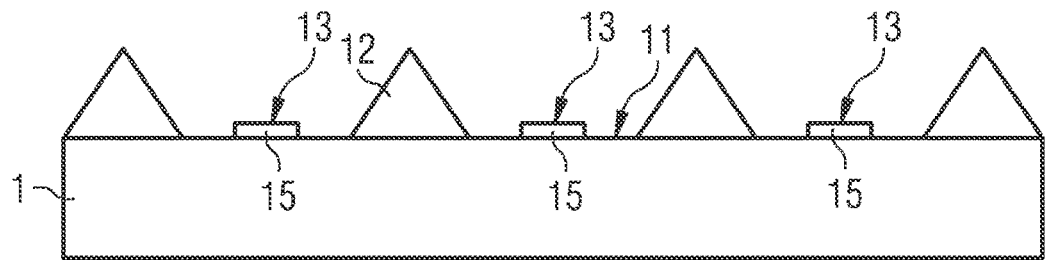
FIG. 4A to 4C are schematic views of intermediate steps of an embodiment of the method.
Figure 4B:
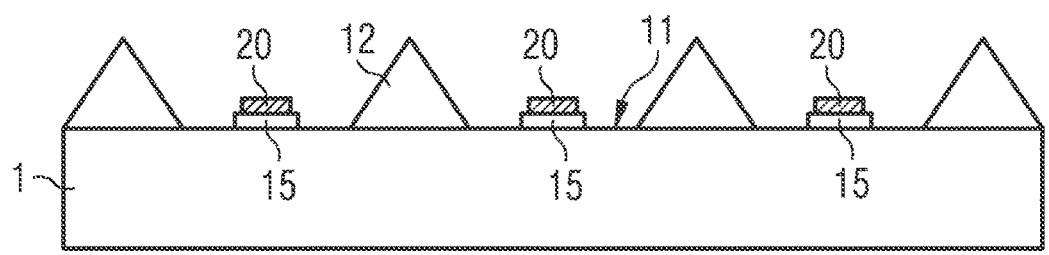
Figure 4C:
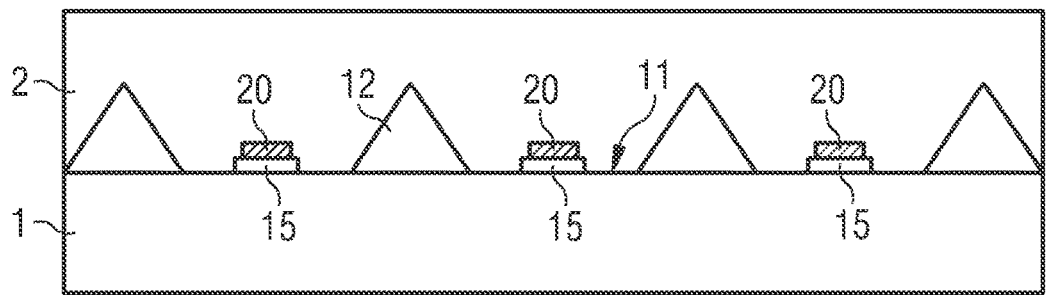

The views of FIG. 4A to 4C illustrate intermediate steps of another embodiment of the method. As in the embodiment of FIG. 3A, the growth substrate 1 has a planar area 11 with three-dimensional surface structures 12 arranged thereon. As seen from FIG. 4A, a nucleation layer 15 has been deposited on part of the planar area 11. The nucleation layer 15 preferably includes an oxygen-containing aluminum nitride (AlN:O). Because the nucleation layer 15 promotes the growth of a nitride semiconductor material on it, the growth area is essentially constituted by the surface of the nucleation layer 15. As in the aforegoing embodiment, the growth area 13 is therefore smaller than the planar area 11.

As can be seen from FIG. 4B, growth essentially takes place on the surface of the nucleation layer 15 on which the growth areas 20 are formed. After the buffer layer 2 has been completely grown, the further areas of the growth surface, in particular the three-dimensional surface structures 12, will have been overgrown by the semiconductor material, as shown in FIG. 4C.

FIGS. 5A, 5B and 5C are each plan views of examples of growth substrates 1. These schematical views, which are not true to scale, illustrate different ways of how the planar areas 11 and the three-dimensional surface structures can be arranged.

In the exemplary embodiment of FIG. 5A, the planar area 11 of the growth substrate 1 is a continuous area surrounding a plurality of three-dimensional surface structures 12 which may be conical.

In the exemplary embodiment of FIG. 5B, by contrast, the growth substrate 1 has a plurality of non-continuous planar areas 11 which are surrounded by a continuous area of three-dimensional surface structures 12. The planar areas 11 may be circular or of any other shape in cross-section. Because the planar areas 11 of this embodiment are not continuous, the share of the planar area 11 in the total surface of the growth substrate 1 can be kept relatively small as compared to the exemplary embodiment of FIG. 5A.

The growth substrate 1 of the embodiment of FIG. 5C has a plurality of non-continuous growth areas 13 which may for example be constituted by openings in a layer 14 on which a nitride semiconductor material essentially cannot grow. Furthermore, the growth substrate 1 has three-dimensional growth structures 12 which protrude from the layer 14, for example. In a finished component, the three-dimensional surface structures 12 are advantageously adapted to reflect or scatter radiation emitted towards the growth substrate 1 in the direction of a radiation exit surface.

The invention is not restricted by the description given with reference to the exemplary embodiments. Rather, the invention encompasses any novel feature and any combination of features, in particular any combination of features in the claims, even if this feature or this combination is not itself explicitly indicated in the claims or exemplary embodiments.

LIST OF REFERENCE CHARACTERS 1 growth substrate
2 buffer layer
3 n-type semiconductor region
4 active layer
5 p-type semiconductor region
6 p-contact
7 n-contact
8 mirror layer
9 light beam
10 growth surface
11 planar area
12 surface structures
13 growth area
14 layer
15 nucleation layer
20 growth area
30 semiconductor layer sequence
31 radiation outcoupling surface
100 nitride semiconductor component

The invention claimed is:

1. A method for producing a nitride semiconductor component, comprising the following steps:
providing a structured growth substrate, the structured growth substrate having a growth surface formed from a planar area with a plurality of three-dimensionally shaped surface structures which are protrusions of the structured growth substrate that extend away from the planar area, wherein the protrusions of the structured growth substrate have a conical or pyramidal shape,
growing a nitride-based semiconductor layer sequence on the growth surface, the growing beginning selectively on a growth area of the growth substrate, wherein the growth area is less than 40% of the growth surface, and
depositing a layer on part of the planar area so as to reduce the growth area, the layer comprising a material on which growth of a nitride semiconductor layer material is difficult or impossible.

2. The method according to claim 1, wherein the growth area is less than 25% of the growth surface.

3. The method according to claim 1, wherein the growth area is less than 5% of the growth surface.

4. The method according to claim 1, wherein the growth area is the planar area or part of the planar area.

5. The method according to claim 1, wherein the growth area is smaller than the planar area.

6. The method according to claim 1, wherein the material includes a silicon oxide, a silicon nitride, or a titanium nitride.

7. The method according to claim 1, wherein the growth area is constituted by a plurality of non-interconnected portions of the planar area.

8. The method according to claim 7, wherein the non-interconnected portions of the planar area abut on the three-dimensional structures.

9. The method according to claim 7, wherein a layer is deposited on part of the planar area so as to reduce the growth area, which layer is of a material on which growth of a nitride semiconductor material is difficult or impossible, and wherein the non-interconnected portions of the planar area are openings in the layer of the material on which growth of a nitride semiconductor material is difficult or impossible.

10. The method according to claim 1, wherein a nucleation layer is deposited on at least part of the planar area, which layer promotes the growth of a nitride semiconductor material thereon.

11. The method according to claim 10, wherein the nucleation layer includes an oxygen-containing aluminum nitride.

12. The method according to claim 1, wherein the growth substrate comprises sapphire.

13. A nitride semiconductor component, comprising:
a structured growth substrate, the structured growth substrate having a growth surface formed from a planar area with a plurality of three-dimensionally shaped surface structures which are protrusions of the structured growth substrate that extend away from the planar area, and
a nitride-based semiconductor layer sequence arranged on the growth surface,
wherein
the nitride-based semiconductor layer sequence has growth areas arranged on a growth area at an interface with the growth substrate,
the growth areas have a higher defect density than the rest of the semiconductor layer sequence,
the growth area is less than 45% of the growth surface, and
the protrusions of the structured growth substrate have a conical or pyramidal shape, and
a layer is deposited on part of the planar area so as to reduce the growth area, the layer comprising a material on which growth of a nitride semiconductor layer material is difficult or impossible.

14. The nitride semiconductor component according to claim 13, wherein
the nitride semiconductor component is a radiation-emitting optoelectronic component, and
the growth substrate is transparent.

15. The nitride semiconductor component according to claim 14, wherein the growth substrate is a sapphire substrate.

16. The nitride semiconductor component according to claim 13, wherein a mirror layer is provided on a rear side of the growth substrate which faces away from the semiconductor layer sequence.

17. The nitride semiconductor component according to claim 13, wherein the material includes a silicon oxide, a silicon nitride, or a titanium nitride.

* * * * *